United States Patent [19]  [11]  4,188,215
Sato et al.  [45]  Feb. 12, 1980

[54] PHOTOSENSITIVE PRINTING PLATE, METHOD OF PREPARING SAME, AND METHOD OF PROCESSING SAME

[75] Inventors: Masamichi Sato; Sadaharu Ikeda; Tomoaki Ikeda, all of Asaka, Japan

[73] Assignee: Fuji Photo Film Co., Ltd., Minami-ashigara, Japan

[21] Appl. No.: 899,680

[22] Filed: Apr. 24, 1978

Related U.S. Application Data

[63] Continuation-in-part of Ser. No. 742,494, Nov. 17, 1976, abandoned.

[30] Foreign Application Priority Data

Nov. 17, 1975 [JP] Japan .................................. 50-138424

[51] Int. Cl.² .......................... G03C 1/76; G03C 3/00; G03F 7/02
[52] U.S. Cl. ..................................... 430/156; 430/328; 430/303; 430/270; 430/275; 430/271
[58] Field of Search .............................. 96/33, 68, 36.3

[56] References Cited

U.S. PATENT DOCUMENTS

| T870,022 | 1/1970 | Kenyon | 96/33 |
| 3,245,793 | 4/1966 | Smith | 96/68 |
| 3,313,626 | 4/1967 | Whitney | 96/68 |
| 3,442,648 | 5/1969 | Smith | 96/68 |
| 3,511,658 | 5/1970 | Manko | 96/68 |
| 3,515,547 | 6/1970 | Allentoff | 96/68 |
| 3,567,445 | 3/1971 | Atkinson | 96/33 |
| 3,730,717 | 5/1973 | Chu | 96/68 |
| 3,844,789 | 10/1974 | Bates | 96/68 |

FOREIGN PATENT DOCUMENTS 2517711 11/1976 Fed. Rep. of Germany .............. 96/68

Primary Examiner—Mary F. Kelley
Attorney, Agent, or Firm—Sughrue, Rothwell, Mion, Zinn and Macpeak

[57] ABSTRACT

A photosensitive printing plate with high sensitivity comprising a support having a hydrophilic surface and formed in succession thereon (1) a layer of an oleophilic photosensitive resin composition whose solubility in a solvent is changed by exposure to light to which the resin composition layer is sensitive and (2) directly on the layer (1) a layer containing a dispersion of particles of photosensitive silver halide grains coated with a water-soluble polymer in an oleophilic polymer capable of being dissolved in a developer for the photosensitive resin composition.

The photosensitive printing plate is first image-wise exposed to light to which only the layer containing the silver halide is sensitive followed by silver halide development with an aqueous developer solution to form a silver image, subjected then to overall exposure using light to which the layer of the photosensitive resin composition is sensitive, and developed with a developer which dissolves the oleophilic polymer in the layer containing the silver halide and only one of either the exposed portions or the unexposed portions of the layer of the photosensitive resin composition.

12 Claims, No Drawings

PHOTOSENSITIVE PRINTING PLATE, METHOD OF PREPARING SAME, AND METHOD OF PROCESSING SAME

CROSS-REFERENCES TO RELATED APPLICATIONS

This application is a continuation-in-part application of Ser. No. 742,494, filed Nov. 17, 1976 now abandoned.

BACKGROUND OF THE INVENTION

1. Field of the Invention

The present invention relates to photosensitive printing plates, a method of preparing the plates, and also a method of processing the plates. More particularly, the invention relates to a photosensitive printing plate having (1) a layer containing particles of photosensitive silver halide grains coated with a hydrophilic polymer dispersed in an oleophilic polymer and (2) directly on layer (1) a layer of a photosensitive resin composition, the printing plate having a high sensitivity in terms of camera speed, and also a method of preparing and a method of processing such a printing plate.

By the term "a photosensitive printing plate having a high sensitivity in terms of camera speed" or "photosensitive printing plate with camera speed sensitivity" is meant that the photosensitive material is highly sensitive photographically to such an extent that the photosensitive material can be imagewise exposed by focusing an image of an original on the photosensitive layer of the photosensitive material through a focusing lens system using a camera. On the other hand, by the term "a photosensitive printing plate having a contact speed sensitivity" or "photosensitive printing plate with contact speed sensitivity" is meant that the photosensitive material has a sensitivity such that the photosensitive material can be exposed to light to which the photosensitive compound in the photosensitive layer is sensitive through a transparent photographic positive or negative image as an original in contact with the photosensitive material.

The majority of photosensitive printing plates which are commercially used at present are those having a contact speed sensitivity. Since photosensitive printing plates having a contact speed sensitivity require a transparent photographic negative or positive for making printing plates and thus in the case of using such photosensitive printing plates, the number of steps required for making printing plates is larger than those in the case where no transparent photographic negative or positive is required.

Conventional photosensitive compounds used for photosensitive printing plates, in particular, negative working printing plates are diazo compounds or photosensitive polymers such as, for example, polyvinyl cinnamate, but these compounds have a very low photographic sensitivity and hence are unsuitable as photosensitive compounds for photosensitive printing plates having a camera speed sensitivity. In other words, the majority of conventional photosensitive printing plates have a contact speed sensitivity as described above.

The most general photosensitive compounds for photographic materials having a camera speed sensitivity are silver halide and photosensitive printing plates having silver halide emulsion layers have now been produced but these known photosensitive printing plates having a camera speed sensitivity require comparatively complicated processing operations and further they have a low printing life, that is, the number of prints which can be obtained from these photosensitive printing plates is not very large.

Other examples of photosensitive printing plates having a camera speed sensitivity are composite type photosensitive printing plates each comprising a support having formed thereon a photosensitive layer with a contact speed sensitivity (hereinafter, this layer is referred to as the first photosensitive layer) and a silver halide emulsion layer with a camera speed sensitivity (hereinafter, this layer is referred to as the second photosensitive layer) as described in the specifications of Japanese Patent Publication Nos. 13,128/1965 and 23,721/1972; U.S. Pat. Defensive Publication No. T-870,022; and French Pat. No. 2,151,182.

However, in these composite type photosensitive printing plates, the first photosensitive layer with a contact speed sensitivity has poor adhesive properties to the hydrophilic silver halide emulsion layer with a camera speed sensitivity due to the oleophilic property thereof and thus it has been proposed to form an interlayer or a subbing layer having good adhesive properties to both layers between the layers as disclosed in the specifications of, for instance, U.S. Pat. Defensive Publication No. T-870,022 and Japanese Patent Publication No. 23,721/1972. However, the presence of such an interlayer causes the production process of the photosensitive printing plates to be complicated.

Another attempt for improving the adhesive properties between the first photosensitive layer and the second photosensitive layer is disclosed in the specifications of Japanese Patent Publication No. 13,128/1965 and French Pat. No. 2,151,182 and in these descriptions, an interlayer is not employed but it is well known that in such case the silver halide emulsion layer is stripped from the oleophilic surface of the second photosensitive layer in processing the silver halide emulsion layer, which makes the use of such photosensitive printing plates unpractical.

Also, these composite type photosensitive printing plates are generally processed as follows; that is, the silver halide emulsion layer is first imagewise exposed followed by silver halide development to form a silver image and then the first photosensitive layer is exposed to ultraviolet rays through the silver image formed thereon. Then, after removing the silver halide emulsion layer, the first photosensitive layer is developed. In other words, in order to process these composite type photosensitive printing plates, a step of removing the second photosensitive layer and a step of developing the first photosensitive layer are required.

SUMMARY OF THE INVENTION

As the result of various investigations to overcome the above described difficulties in conventional photosensitive printing plates having a camera speed sensitivity, it has now been discovered that a photosensitive composition prepared by dispersing a composition comprising particles of photosensitive silver halide grains coated with a water-soluble polymer in an oleophilic polymer is stable, easily increases the photographic sensitivity, and possesses a good affinity to an oleophilic material and based on the discovery, the present invention has been attained.

An object of this invention is, therefore, to provide photosensitive printing plates that have a camera speed sensitivity and can be easily prepared and easily processed.

Another object of this invention is to provide a simple method of producing photosensitive printing plates having a camera speed sensitivity.

A further object of this invention is to provide a method of processing photosensitive printing plates having a camera speed sensitivity.

That is, according to the present invention, there are provided;

(a) a photosensitive printing plate comprising a support with a hydrophilic surface having formed in succession thereon (1) a layer of an oleophilic photosensitive resin composition whose solubility in a solvent is changed by exposure to light to which the photosensitive resin composition layer is sensitive and (2) directly on the layer (1) a layer of photosensitive silver halide which is developable using an aqueous developer solution for the silver halide and comprising a dispersion of particles of photosensitive silver halide grains coated with a water-soluble polymer in an oleophilic polymer capable of being dissolved in a developer for the photosensitive resin composition.

(b) a method of preparing a photosensitive printing plate which comprises coating in a layer on a support with a hydrophilic surface a solution of an oleophilic photosensitive resin composition whose solubility in a solvent is changed by exposure to light to which the photosensitive resin composition layer is sensitive in a first solvent and directly coating thereon an oleophilic polymer having dispersed therein particles of photosensitive silver halide grains coated with a water-soluble polymer in a second solvent which does not dissolve the photosensitive resin composition but can dissolve the oleophilic polymer, and (c) a method of producing a printing plate by processing the photosensitive printing plate as set forth in (1) above which comprises imagewise exposing the photosensitive printing plate to light to which only the layer (2) of the silver halide is sensitive, developing the layer (2) of the silver halide to form a silver image using an aqueous developer solution for the silver halide, subjecting the photosensitive printing plate to an overall exposure using light to which the photosensitive resin composition layer (1) is sensitive, and then developing the photosensitive resin composition layer (1) with a developer which dissolves the oleophilic polymer in the layer (2) of the silver halide and only one of either the exposed portions or the unexposed portions of the photosensitive resin composition layer (1).

DESCRIPTION OF THE PREFERRED EMBODIMENTS

Any support having a hydrophilic surface used conventionally for making photosensitive printing plates can be used as the support for the photosensitive printing plate of this invention. Examples of suitable supports are hydrophilic metal plates such as a lightly grained aluminum plate, a lightly grained zinc plate, a lightly grained chromium plate, etc.; composite metal plates prepared by forming a thin layer of a hydrophilic metal such as aluminum, zinc, chromium, etc., on a metal plate such as an iron plate, a steel plate, a bronze plate, a stainless steel alloy plate, etc.; plastic films such as those of polyethylene terephthalate, polycarbonate, cellulose nitrate, cellulose acetate, cellulose acetate butyrate, cellulose acetate propionate, polystyrene, polyethylene, polypropylene, etc., each of which has been treated to render at least one surface thereof hydrophilic; papers impregnated or coated with the above described plastics and treated to render at least one surface hydrophilic.

The materials described above can be treated to have an hydrophilic property in an appropriate known manner such as hydrolysis with alkali or acid, corona discharging, ultraviolet irradiation, flame treatment, coating of a subbing solution containing an hydrophilic material, etc.

The layer (1) of the photosensitive resin composition used in this invention comprises a layer that is sensitive to ultraviolet rays (e.g., a wave length of about 200 nm to about 400 nm) and when the layer is exposed to ultraviolet rays through a photographic negative or positive, a change occurs at the exposed areas, whereby the exposed portions of the layer either become insoluble or soluble in a particular solvent. The particular solvent used for the purpose is a developer for the photosensitive resin composition. The photosensitive resin composition layer thus exposed is developed by removing the unchanged portion of the unexposed area or the changed portion of the exposed area of the photosensitive resin composition layer with the developer thus to leave the undissolved portions forming the positive image of the original, whereby the hydrophilic surface of the support is locally uncovered at the dissolved portions of the photosensitive resin composition layer. Since the photosensitive resin composition layer is originally oleophilic and since the layer becomes oleophilic by exposure, the undissolved portions are more oleophilic.

Examples of photosensitive compounds contained in the photosensitive resin composition used in this invention where the exposed portions of the photosensitive resin composition layer become insoluble in the developer include a compound having a diazonium salt radical, an azide compound, and a compound having a cinnamoyl group. Examples of compounds having a diazonium salt radical used as a negative-type photosensitive resin in this invention are p-diazodiphenylamineparaformaldehyde condensates as well as 1-diazo-4-dimethylaminobenzene hydrofluoroborate, 1-diazo-3-methyl-4-dimethylaniline sulfate, 1-diazo-3-monoethylnaphthylamine, etc., as described in the specification of U.S. Pat. No. 1,762,033. Also, suitable examples of azide compounds which can be used in this invention are p-phenylene bisazide, p-azidobenzophenone, 4,4'-diazidobenzophenone, 4,4'-diazidodiphenylmethane, 4,4'-diazidostilbene, 4,4'-diazidochalcone, 2,6-di(4'-azidobenzal)cyclohexanone, 2,6-di(4'-azidobenzal)-4-methylcyclohexanone, etc., as described in the specifications of U.S. Pat. Nos. 2,852,379 and 2,940,853. Furthermore, examples of polymers having an azide group in the molecule are vinyl polyazidobenzoate, vinyl polyazidophthalate, polyvinyl azidobenzal acetal, etc., as described in the specifications of Japanese Patent Publication No. 28,499/1965 and U.S. Pat. No. 3,475,176 (corresponding to Japanese Patent Publication No. 22,085/1970). Also, examples of photosensitive resins having a cinnamoyl group as the photosensitive group are polyvinyl cinnamate and cinnamylidene acetate derivatives of polyvinyl alcohol such as, for example, polyvinyl cinnamylidene acetate, polyvinyl cinnamate-cinnamylidene acetate, polyvinylethoxycarbonylmethyl carbamate-cinnamylidene acetate, polyvinyl acetate-cinnamylidene acetate, etc. Other examples of photosensitive compounds which can be used in this invention for this purpose are acrylamides, acrylates, and those compounds containing an acryloyl group, etc.

Commercially available negative type photosensitive resin compositions are, for example, KPR, KTFR, and KMER (all trade names, made by Eastman Kodak Co.), Western Wipeon (trade name, made by Western Litho Plate Co.), Wipe-O-Sensitizer (trade name, made by Litho Chemical & Supply Co.), E. P. P. R., OMR, and TPR (all trade names, made by Tokyo Oka Kogyo K. K.), Nega Coat and Fuji Super Resist (all trade names, made by Fuji Yakihin Kogyo K. K.), Wipedol and Resist S (all trade names, made by Okamoto Kagaku Kogyo K. K.), and KY Resist (trade name, made by Yamatoya Shoten K. K.).

On the other hand, examples of the photosensitive compounds contained in the photosensitive resin compositions used in this invention where the exposed portions of the photosensitive resin composition layer become soluble in the developer, are 1,2-naphthoquinonediazides, such as, for example, the 2,3,4-trihydroxybenzophenone bis-(naphthoquinone-1,2-diazido-5-sulfonate) as described in the specification of U.S. Patent No. 3,148,983 (corresponding to Japanese Patent Publication No. 180,015/1962); 2-(naphthoquinone-1,2-diazido-5-sulfonyloxy)-3-hydroxy-naphthalene as described in the specification of U.S. Pat. No. 3,130,048 (corresponding to Japanese Patent Publication No. 3627/1962); naphthoquinone-1,2-diazido-5-sulfanilide as described in U.S. Pat. No. 3,126,281 (corresponding to Japanese Patent Publication No. 1954/1962); and the naphthoquinone-1,2-diazido-5-sulfonic acid novolak ester as described in Japanese Patent Publication No. 9610/1970.

Commercially available positive type photosensitive resin compositions are, for example, KPR (Type-3) (trade name, made by Eastman Kodak Co.); AZ-340, AZ-1350, AZ-111, and AZ-119 (all trade names, made by Azoplate-Shipley Co.); Photosol B and Photosol E (all trade names, made by Tokyo Oka Kogyo K. K.); FPPR-300, FPPR-700, and EPPR-1000 (all trade names, made by Fuji Yakuhin Kogyo K. K.), etc.

The layer (2) of the particles of silver halide grains coated with the water-soluble polymer dispersed in an oleophilic binder used in this invention differs from conventional gelatino silver halide emulsions and is a dispersion in an oleophilic resin of particles of silver halide grains coated with a water-soluble polymer such as, for example, gelatin. That is, in the layer of the silver halide used in this invention, particles of silver halide grains coated with a water-soluble polymer are used in place of conventional silver halide grains and an oleophilic resin binder is used in place of a water-soluble binder for a conventional silver halide emulsion.

The water-soluble polymer used for coating the silver halide grains employed in this invention is a water-soluble polymer used as a binder for conventional silver halide emulsions. A typical example of such a water-soluble polymer is gelatin. Examples of other water-soluble polymers which can be used in this invention are a so-called gelatin derivative (prepared by processing gelatin with a compound having a group capable of reacting with the functional groups contained in the gelatin molecule (i.e., amino groups, imino groups, hydroxy groups or carboxy groups) or prepared by grafting a molecular chain of other high molecular weight substances to a molecular chain or to functional groups contained in the gelatin molecule); colloidal albumin; casein; cellulose derivatives such as methyl cellulose, ethyl cellulose, carboxymethyl cellulose, carboxyethyl cellulose, ethylhydroxyethyl cellulose, ethylmethyl cellulose, hydroxymethyl cellulose, hydroxyethyl cellulose, hydroxypropyl cellulose, hydroxyethylmethyl cellulose, hydroxypropylmethyl cellulose, sodium carboxymethyl cellulose, sodium carboxymethylhydroxyethyl cellulose, sodium cellulose sulfate; saccharide derivatives such as starch, carboxymethyl starch, dialdehyde starch, sodium alginate, agar-agar, plant glue, tragacanth gum, gum arabic; synthetic water-soluble polymers such as polyvinyl alcohol, and a partial ester, partial ether, or partial acetal of polyvinyl alcohol containing the unsubstituted vinyl alcohol unit in a proportion required for it to be water soluble; poly-N-vinyl pyrrolidone, polyvinyl methyl ether, a vinyl methyl ether-maleic anhydride copolymer, a styrene-maleic anhydride copolymer, 88 to 99% hydrolyzed polyvinyl acetate, polyacrylamide, polysodium acrylate, polyethylene glycol, and the like, mixtures comprising two or more thereof; etc. As one skilled in the art will appreciate, the molecular weight of the above polymers cannot be unequivocally defined since molecular weight depends highly upon the type of hydrophilic polymer used. However, certain exemplary preferred molecular weights and the like are as follows: cellulose derivatives—a molecular weight of about 80,000 to about 700,000; polyvinyl alcohol—a polymerization degree of less than 1,500 and a degree of saponification of more than 85 mol%; polyvinyl pyrrolidone—a molecular weight of about 10,000 to 360,000; polyacrylamide—a molecular weight of from about 30,000 to about 800,000.

As for suitable compounds for preparing the gelatin derivatives, e.g., isocyanates, acid chlorides and acid anhydrides as described in U.S. Pat. No. 2,614,928, acid anhydrides as described in U.S. Pat. No. 3,118,766, bromoacetic acid as described in Japanese Patent Publication No. 5514/64, phenyl glycidyl ethers as described in Japanese Patent Publication No. 21,845/67, vinyl sulfone compounds as described in U.S. Pat. No. 3,132,945 N-allylvinylsulfonamides as described in British Pat. No. 861,414, maleinimide compounds as described in U.S. Pat. No. 3,186,846, acrylonitriles as described in U.S. Pat. No. 2,594,293, polyalkylene oxides as described in U.S. Pat. No. 3,312,553, epoxy compounds as described in Japanese Patent Publication No. 26845/67, acid esters as described in U.S. Pat. No. 2,763,639, alkanesultones as described in British Pat. No. 1,033,189, and the like. Descriptions of suitable branch high polymers to be grafted on gelatin are given in U.S. Pat. Nos. 2,763,625; 2,831,767; 2,956,884; *Polymer Letters*, 5, 595 (1967), *Photo. Sci. Eng.*, 9, 148 (1965), *J. Polymer Sci. A-1*, 9, 3199 (1971), and the like. Homopolymers or copolymers of compounds which are generally called vinyl monomers, such as acrylic acid, methacrylic acid, the ester, amide, and nitrile derivatives thereof, styrene, etc., are widely used. Hydrophilic vinyl polymers having some compatibility with gelatin, such as homopolymers or copolymers of acrylic acid, acrylamide, methacrylamide, hydroxyalkyl acrylate, hydroxyalkyl methacrylate, etc., are particularly preferred.

The above described water-soluble polymers are described in detail in R. L. Davidson and M. Sittig, *Water-soluble Resins* Van Nostrand-Reinhold, New York, (1968), *Zeitschrift fur Wissenshaftliche Photographie, Photophysik und Photochemie*, 52, 1–24 (1957), U.S. Pat. Nos. 2,563,791, 2,286,215 and 2,322,085.

The silver halide used in this invention can be a silver halide employed in conventional silver halide emulsions. Examples of suitable silver halides are silver chloride, silver bromide, silver iodide, silver chlorobromide, silver chloroiodide, silver chloroiodobromide, etc.

The ratio of the silver halide to the water-soluble polymer used in this invention can be the same as that in conventional silver halide emulsions, with the weight ratio generally ranging from about 8:1 to about 1:6 of the silver halide to the water-soluble polymer.

In a typical example of the preferred silver halide used in this invention, the silver halide contains more than about 90 mole percent silver bromide (and preferably contains less than about 3 mole percent silver iodide), the mean grain size of the silver halide is smaller than about 0.1 μm. (i.e., a so-called Lipmann silver halide), and the ratio of silver halide to the water-soluble polymer (dry basis) is in the range of from about 1:4 to about 8:1 by weight. In another example of the silver halide used in this invention, the silver halide contains more than about 90 mole percent silver bromide (and preferably contains less than about 5 mole percent silver iodide), the mean grain size of the silver halide is smaller than about 1 μm, and the ratio of silver halide to the water-soluble polymer (dry basis) is in the range of from about 1:6 to about 6:1 by weight. In still another example of the silver halide used in this invention, the silver halide contains more than about 59 mole percent silver chloride (and preferably contains more than about 70 mole percent silver chloride), the mean grain size of the silver halide is smaller than about 1 μm, and the ratio of silver halide to the water-soluble polymer (dry basis) is in a range of from about 1:6 to about 6:1 by weight.

The binder resin used in this invention in the layer (2) containing the silver halide grains is an oleophilic resin which is soluble in a coating solvent which does not dissolve the above-described photosensitive resin composition layer and is soluble in a developer for the photosensitive resin composition layer.

Examples of preferred binder resins for the silver halide grain containing layer are resins such as a novolak-type phenol resin, a polymethacrylic acid resin, a copolymer of methyl methacrylate, etc., and resins disclosed in U.S. Pat. No. 3,870,524 such as addition polymers having carboxy groups on the side chain (e.g., acrylic acid/methyl methacrylate copolymers, styrene/acrylic acid copolymers, etc.), cellulose derivatives similarly having carboxy groups on the side chain (e.g., cellulose acetate hydrogen phthalate), polyvinyl alcohol derivatives (e.g., polyvinyl acetate), polyamides, polyurethanes, ethyl cellulose, nitrocellulose and the like.

The preferred amount of the oleophilic binder resin ranges from 0.1 weight percent to 50 weight percent of the silver halide used.

The coating solvent for the silver halide layer used in this invention is chosen depending on the binder present in the photosensitive resin composition (if one is present) and the oleophilic binder used in the silver halide. For example, when the photosensitive resin composition contains mainly polyvinyl cinnamate as the photosensitive component and the oleophilic binder for the silver halide layer is a novolak type phenol resin, an organic solvent compatible with water such as methanol, ethanol, isopropanol, etc., can be suitably used as the coating solvent for the silver halide emulsion. However, an organic solvent which is compatible with the above-described organic solvent and which is not compatible with water can be also used. The developer for the photosensitive resin composition used in this invention can be selected from a wide range of materials such as dioxane, xylene, isopropanol, trichloroethane, an aqueous solution of an alkali such as potassium hydroxide, sodium silicate, sodium phosphate, sodium hypochlorite, sodium carbonate, etc., containing an organic solvent compatible with water, such as an alcohol (for example, methanol, ethanol, isopropanol, butanol, benzyl alcohol, etc.), a ketone (for example, acetone, methyl ethyl ketone, etc.), methyl Cellosolve acetate, butyl Cellosolve, etc.

The coating dispersion used in this invention can be prepared by the following manner. That is, a water-soluble polymer-silver halide emulsion is first prepared in a conventional manner and when an organic solvent (e.g., acetone, methyl alcohol, ethyl alcohol, isopropyl alcohol, etc.) which does not dissolve the water-soluble polymer but is miscible with water is added to the emulsion, the water-soluble polymer deposits on the surfaces of the silver halide grains and thus particles of silver halide grains coated with the water-soluble polymer are precipitated. A suitable amount of the organic solvent to the amount of the hydrophilic polymer-silver halide emulsion is about 5:1 to about 1000:1, preferably about 10:1 to about 500:1 by volume. The precipitates are recovered by decantation and when a dispersing agent such as a solution of salicyclic acid in methanol, ethanol, acetone, etc., (e.g., using about 4 to about 40 g of salicylic acid per 100 g of the silver halide) is added to the precipitates, particles of silver halide grains coated with the water-soluble polymer are redispersed in the organic solvent such as methanol, ethanol, acetone, etc.

If necessary, another organic solvent such as, for example, isopropanol, ethyl acetate, butyl acetate, cyclohexanone, xylene, toluene, an isoparaffinic petroleum solvent, decalin, cyclohexane, etc., can be added to the dispersion thus obtained. Also, a resin soluble in these organic solvents and soluble in the developer for the above-described photosensitive resin composition can be added to the dispersion.

The coating dispersion thus obtained is a dispersion of particles of silver halide grains coated with the water-soluble polymer in an organic solvent in which an oleophilic binder resin is dissolved and then when such a coating dispersion is directly coated on the oleophilic surface of the layer of the photosensitive resin composition on the support without forming a subbing layer thereon, a silver halide layer is formed thereon with good adhesive properties thereto. Furthermore, an aqueous developer for the silver halide can easily permeate into the silver halide emulsion layer thus formed.

The coating dispersion used in this invention can be also prepared in the following manner. That is, a water-soluble polymer-silver halide emulsion having a low water content (e.g., solids content above about 90% by weight) is prepared in a conventional manner (utilizing, for example, dehydration by cooling) and a solution of a dispersing agent such as salicylic acid dissolved in an organic solvent which is miscible with water is added to the emulsion to disperse the particles of silver halide grains coated with the water-soluble polymer in the organic solvent. Thereafter, a resin soluble in the organic solvent is added to the dispersion. Alternatively, the above procedure can be performed by dissolving the resin in the organic solvent before the particles of silver halide grains coated with the water-soluble polymer are dispersed in the organic solvent.

It has now been found that the silver halide layer formed according to the invention possesses almost the same photographic properties (such as, sensitivity, resolving power, fog, image density, etc.) as those of conventional water-soluble polymer-silver halide emulsion layers. While not desiring to be bound, the reason is believed to be that when a water-soluble polymer-silver halide emulsion prepared using a method for producing conventional water-soluble polymer-silver halide emulsions is dispersed in an organic solvent, sensitizing dyes adsorbed on the silver halide grains and other additives present in the water-soluble polymer remain as is without being dissolved off in the organic solvent since the silver halide grains are coated with the water soluble polymer.

Thus conventional chemical sensitization and dye sensitization can be employed with the silver halide used in this invention and other effective additives such as antifoggants, stabilizers, etc., can be added to the silver halide emulsion used as is conventionally employed.

The silver halide used in this invention can be advantageously optically sensitized with known optical sensitizers such as the cyanine dyes and merocyanine dyes as described in U.S. Pat. Nos. 1,346,301; 1,846,302; 1,942,854; 1,990,507; 2,493,747; 2,739,964; 2,493,748; 2,503,776; 2,519,001; 2,666,761; 2,734,900; 2,739,149; and British Pat. No. 450,958.

Suitable exposures of the silver halide layer used in this invention can be electromagnetic radiation, to which the silver halide is sensitive, e.g., visible, ultraviolet, electron beams, X-ray etc. With optically sensitized silver halide, it is convenient to select light mainly having a wavelength corresponding to the optically sensitized region of the silver halide as the light for exposing the silver halide layer.

The silver halide is advantageously chemically sensitized with salts of noble metals such as ruthenium, rhodium, palladium, iridium, platinum, etc., as described in U.S. Pat. Nos. 2,448,060, 2,566,245; and 2,566,263. Also, the silver halide can be chemically sensitized with a gold salt as described in U.S. Pat. No. 2,339,083 or stabilized with gold metal as described in U.S. Pat. Nos. 2,597,856 and 2,597,915. Furthermore, a thiopolymer as described in U.S. Pat. No. 3,046,129 can advantageously be incorporated in the silver halide layer. In addition, the silver halide can be stabilized with mercury compounds as described in U.S. Pat. No. 3,046,129, column 20, line 51 to column 21, line 3, triazoles, azaindenes, disulfides, quaternary benzothiazolium compounds, zinc salts and cadmium salts.

The silver halide can contain light-absorbing dyes as described in U.S. Pat. Nos. 2,527,583; 2,611,696; 3,247,127; 3,260,601; etc.

The water soluble polymer used with the silver halide is advantageously hardened with a suitable hardening agent for conventional hydrophilic colloids, such as formaldehyde or a like hardener; N-methylol compounds as described in U.S. Pat. Nos. 2,732,316 and 2,586,168; carbodiimide compounds as described in U.S. Pat. No. 3,100,704; epoxy compounds as described in U.S. Pat. No. 3,091,537; halogen-substituted fatty acids (e.g., mucobromic acid, etc.); compounds having many acid anhydride groups; methanesulfonic acid bisester; dialdehydes or the sodium bisulfite adducts thereof such as β-methylglutaraldehyde bissodium bisulfite; bisaziridinecarboxamide (e.g., trimethylenebis(1-aziridinecarboxamide)); triazine derivatives (e.g., 2-hydroxy-4,6-dichloro-s-triazine, etc.); and the like.

The preparation of conventional silver halides and use therewith of chemical sensitizers, dye sensitizers, antifoggants, stabilizers, etc. are described in detail in Pierre Glafkides: *Photographic Chemistry* Fountain Press, London, (1958 and 1960); G. F. Duffin: *Photographic Emulsion Chemistry* The Focal Press, London, (1966) V. L. Zelikman and S. M. Levi: *Making and Coating Photographic Emulsions* The Focal Press, London, (1964) C. E. K. Mees et al: *The Theory of the Photographic Process* (2nd and 3rd Ed) The Macmillan Co., New York, (1954 and 1966).

If the amount of the oleophilic binder resin added to the silver halide used in this invention is too large, the permeability of the silver halide developer becomes poor prolonging the period of time required for finishing development and also reducing the maximum image density formed, while if the amount of the oleophilic binder resin is too small, it becomes difficult to maintain high adhesion between the silver halide layer and the oleophilic surface of the photosensitive resin composition layer. A preferred amount of the oleophilic binder resin is from 0.001 to 0.5 part by weight per part by weight of silver halide grains.

If desired, in addition, a protective layer can be formed on the silver halide layer of the photosensitive printing plate of this invention and any known compositions for protective layers can be also used in this invention as such a protective layer.

The silver halide layer of the present invention can be developed and fixed in accordance with processings for a conventional silver halide photographic material using conventional silver halide developing agents and fixing agents. Such processings, developing agents, fixing agents and other processing agents are described in, for example, C. B. Neblette *Photography-its materials and processes*, 6th edition (D. Van Nostrand Co., Inc., 1962 Princeton, New Jersey); L. F. A. Mason *Photographic Processing Chemistry* (The Focal Press, 1966 London); and P. Glafkides (translated by K. M. Hornody) *Photographic Chemistry* (in two vol., Fountain Press, 1958 and 1960, London).

The photosensitive layer of the present invention can be developed fundamentally according to developing processes and developing solutions as are disclosed in U.S. Pat. No. 2,760,863 and the aforementioned Patents referring to the photosensitive compounds contained in the photosensitive resin composition.

The invention will further be specifically described by reference to the following examples, but the invention is not to be construed as being limited to these examples. Unless otherwise indicated, all parts, percents, ratios and the like are by weight.

EXAMPLE 1

A degreased 3S grade aluminum plate of about 3 mm thick was immersed in an aqueous solution of sulfuric acid a concentration of about 20% at temperature of about 30° C. and then an electric current of a current density of 3 amperes/dm$^2$ was passed through the aqueous solution for 2 minutes to anodically oxidize the surface of the aluminum plate. The aluminum plate thus treated with then withdrawn from the solution, washed with water; and dried. Then, the following photosensitive resin composition (coating composition) was coated on the aluminum plate in a thickness of 2 μm (dry) and dried for 3 minutes at a temperature of 80° C.

| Coating Composition: | |
|---|---|
| Poly-(β-cinnamoyloxyethyl methacrylate) [η] = 0.14 | 1 g |
| Copolymer of p-Phenylenediacrylic acid and 1,4-bis(β-Hydroxyethoxy)cyclohexane ([η] = 0.15 in methyl ethyl ketone at 25° C.) | 1 g |
| N-Methyl-2-benoylmethylene-β-naphthothiazole | 140 mg |
| 1,2-Dichloroethane | 12 g |
| Methyl Cellosolve Acetate | 6 g |

The above composition was the same as that of a photosensitive composition for a conventional planographic printing plate.

Then, on the layer thus formed was further coated directly a silver halide coating composition prepared as shown below in a thickness of about 4 μm (dry) and then dried to provide a photosensitive printing plate of camera speed sensitivity.

Preparation of the Silver Halide Layer:

Using, 50 g of gelatin and 200 g of silver halide composed of 70 mole percent silver chloride and 30 mole percent silver bromide, 1,500 ml of a gelatino silver chlorobromide emulsion (the mean grain size of the silver chlorobromide being about 0.1 μm) was prepared. The silver halide emulsion was physically ripened, chemically ripened by adding thereto sodium thiosulfate and chloroauric (III) acid, and then optically sensitized to 510–560 nm by adding thereto 0.15 g of 5-[2-(3-methylthiazolinylidene)ethylidene]-3-carboxymethyl rhodanine.

The gelatino silver halide emulsion thus obtained was mixed with 3 liters of water followed by heating to 40° C. Then, 4 liters of acetone was added to the mixture with stirring and the resultant mixture was allowed to stand for 10 minutes under water cooling, whereby particles of silver halide coated with gelatin precipitated. The supernatant liquid was removed to recover the precipitate and it was dispersed well by heating to 40° C. Then, when a solution of 15 g of salicylic acid in 150 ml of methanol was added to the dispersion with good stirring, the particles of silver halide grains coated with gelatin were dispersed in methanol. Thereafter, 1400 ml. of methanol was added to the dispersion and further 4 g of a phenol resin (PR-15546, produced by Sumitomo Durez Co., Ltd.) was dissolved in the mixture to provide the silver halide coating composition used for the preparation of the photo sensitive printing plate.

The photo sensitive printing plate of camera speed sensitivity thus prepared was exposed to a positive image in a camera, silver halide developed with a silver halide developer having the following composition for 3 minutes at 24° C., and fixed with a silver halide fixing solution of the following composition for 1 minute at 24° C. to provide a negative silver image.

| Silver Halide Developer Composition: | |
|---|---|
| 1-Phenyl-3-pyrazolidone | 0.5 g |
| Sodium Sulfite (anhydrous) | 50 g |
| Hydroquinone | 12 g |
| Sodium Carbonate (monohydrate) | 60 g |
| Potassium Bromide | 2 g |
| Benzotriazole | 0.2 g |
| 1-Phenyl-5-mercaptotetrazole | 5 mg |

| Silver Halide Developer Composition: | |
|---|---|
| Phenazine-2-carboxylic acid | 1 g |
| Water to make | 1 liter |

| Silver Halide Fix Solution: | |
|---|---|
| Ammonium Thiosulfate (70% aq. soln) | 200 ml |
| Sodium Sulfate (salt) | 15 g |
| Boric acid | 8 g |
| Acetic Acid (glacial) | 1.6 ml |
| Aluminum Sulfate (octadecahydrate) | 10 g |
| Sulfuric Acid (98%) | 2 ml |
| Water to make | 1 liter |

The entire surface of the printing plate was exposed for about 20 seconds using a super high pressure mercury lamp mainly emitting ultraviolet rays of about 380 nm in wave length and then developed by immersion in a developer for the photosensitive resin composition having the following composition for 1 minute followed by rubbing lightly. The silver halide layer was removed by the developer and at the same time the unexposed portions of the photosensitive resin composition layer thereunder were also removed to provide a positive image.

| Photosensitive Resin Developer Composition | |
|---|---|
| Sodium Silicate | 12.5 g |
| Butyl Cellosolve (butyl-3-hydroxyethyl ether) | 20 g |
| Benzyl Alcohol | 10 g |
| Nonionic Surface Active Agent (mainly composed of triethylene glycol, Nickel OP-30, trade name, made by Nikko Chemical Co., Ltd.) | 15 ml |
| Water to make | 1 liter |

The printing plate was then washed with water and mounted on an offset printing machine for printing high-quality prints were obtained and the printing plate could be used to obtain about 50,000 prints.

EXAMPLE 2

The same procedure as in Example 1 was followed using the photosensitive resin coating composition and photosensitive resin developer having the compositions shown below in place of the photosensitive coating composition and developer used in Example 1 and substantially the same result was obtained.

| Photosensitive Resin Coating Composition: | |
|---|---|
| Poly (β-cinnamoyloxyethyl methacrylate-methacrylic acid) (9:1 molar ratio) | 100 g |
| 5-Nitroacenaphthene | 40 mg |
| Methyl Ethyl Ketone | 10 g |
| Monochlorobenzene | 10 g |

| Photosensitive Resin Developer Conpositon: | |
|---|---|
| Sodium Hydroxide | 10 g |
| Butyl Cellosolve | 10 g |
| Benzyl Alcohol | 10 g |
| Water to make | 1 liter |

EXAMPLE 3

The silver halide coating composition prepared as in Example 1 was coated on an LN Plate L (a conventional presensitized printing plate, marketed commercially by Eastman Kodak Co.) to provide a photosensitive printing plate of camera speed sensitivity.

The photosensitive printing plate thus prepared was silver halide developed as in Example 1 to form a silver image, exposed to ultraviolet rays as in Example 1, and then developed with a developer (predominantly γ-butyrolactone) for the LN Plate L, also marketed by Eastman Kodak Co., whereby the silver halide layer and the unexposed portions of the photosensitive layer for the LN Plate L were removed to provide a printing plate.

The printing plate could be used to obtain more than 10,000 copies.

EXAMPLE 4

By following the same procedure as in Example 1 using 5 g of ethyl cellulose (N-200, produced by Hercules, Inc.) in place of the phenol resin for the silver halide coating composition in Example 1, substantially the same result as in Example 1 was obtained.

EXAMPLE 5

Polyvinyl cinnamate (KMER, trade name, produced by Eastman Kodak Co.) was coated on an aluminum plate as used in Example 1 at a dry thickness of about 2 μm. Then, on the layer thus formed was further coated a silver halide coating composition prepared in the following manner at a dry thickness of about 3.5 μm to provide a photosensitive printing plate of camera speed sensitivity.

Preparation of the Silver Halide Coating Composition:

The precipitate of the gelatino-silver halide formed as in Example 1 were kept at 40° C. and a solution of 20 g of salicylic acid in 100 ml of acetone was added with stirring to the precipitate to provide a dispersion. The silver halide coating composition was prepared by adding 4.5 g of nitrocellulose and 1,200 ml of acetone to the dispersion.

The photosensitive printing plate was silver halide developed as in Example 1 to form a negative silver image, the entire surface of the plate was exposed to ultraviolet rays, and then the plate was developed with xylene to remove the silver halide layer and the unexposed portions of the polyvinyl cinnamate layer to provide a positive image.

While the invention has been described in detail and with reference to specific embodiments thereof, it will be apparent to one skilled in the art that various changes and modifications can be made therein without departing from the spirit and scope thereof.

What is claimed is:

1. A photosensitve printing plate comprising a support with a hydrophilic surface having formed in succession thereon (1) a layer of an oleophilic photosensitive resin composition which is sensitive to ultraviolet rays and wherein when the composition is exposed to ultraviolet rays a change occurs at exposed areas, whereby the exposed portions of the layer either become insoluble or soluble in a solvent, and (2) directly on said layer (1), a layer of photosensitive silver halide which is developable using an aqueous developer solution for the silver halide and comprising a dispersion of particles of photosensitive silver halide grains coated with a water soluble polymer in an oleophilic binder resin capable of being dissolved in a developer for said photosensitive resin composition, wherein the ratio of the silver halide to the water-soluble polymer, by weight, is 8:1 to 1:6 and the oleophilic binder is used in an amount of from 0.001 to 0.5 parts by weight per part by weight of the silver halide grains.

2. The photosensitive printing plate of claim 1, wherein said support is a support for a metal plate, a composite metal plate, a plastic film, or a paper impregnated with or coated with a plastic.

3. The photosensitive printing plate of claim 1, wherein said photosensitive resin composition layer (1) is negative-working.

4. The photosensitive printing plate of claim 3, wherein said photosensitive resin composition layer (1) contains a compound having a diazonium salt radical, an azide compound or a compound having a cinnamoyl group.

5. The photosensitive printing plate of claim 1, wherein said photosensitive resin composition layer (1) is positive-working.

6. The photosensitive printing plate of claim 5, wherein said photosensitive resin composition layer (1) contains a 1,2-naphthoquinone-diazide.

7. The photosensitive printing plate of claim 1, wherein said silver halide grains are grains of silver chloride, silver bromide, silver iodide, silver chlorobromide, silver chloroiodide, or silver chloroiodobromide.

8. The photosensitive printing plate of claim 1, wherein said water-soluble polymer coated on said silver halide grains is gelatin, a gelatin derivative, colloidal albumin, casein, a cellulose derivative, a saccharide derivative or a synthetic water-soluble polymer.

9. The photosensitive printing plate precurser of claim 1, wherein said oleophilic polymer binder resin having said coated silver halide grains dispersed therein is a novolak type phenol resin, a polyvinyl alcohol derivative, a polymethacrylic acid resin, a copolymer of methylmethacrylate, an addition polymer containing carboxy groups in the side chains thereof, a cellulose derivative containing carboxy groups in the side chain thereof, a polyamide, a polyurethane, ethylcellulose or nitrocellulose.

10. The photosensitive printing plate precursor of claim 9, wherein said oleophilic polymer binder resin is an acrylic acid/methyl methacrylate copolymer, a styrene/acrylic acid copolymer, cellulose acetate hydrogen phthalate or polyvinyl acetate.

11. A method of preparing a photosensitive printing plate which comprises coating as a layer on a hydrophilic surface of a support a solution of an oleophilic photosensitive resin composition which is sensitive to ultraviolet rays and wherein when the composition is exposed to ultraviolet rays a change occurs at exposed areas, whereby the exposed portions of the layer either become insoluble or soluble in a solvent, in a first solvent and directly coating thereon an oleophilic binder resin having dispersed therein particles of photosensitive silver halide grains coated with a water-soluble polymer in a second solvent which does not dissolve said oleophilic binder resin, wherein the ratio of the silver halide to the water-soluble polymer, by weight, is 8:1 to 1:6 and the oleophilic binder is used in an amount of from 0.001 to 0.5 parts by weight per part by weight of the silver halide grains.

12. A method of forming a printing plate which comprises imagewise exposing a photosensitive printing plate comprising a support with a hydrophilic surface having formed in succession thereon (1) a layer of an oleophilic photosensitive resin composition which is sensitive to ultraviolet rays and wherein when the composition is exposed to ultraviolet rays a change occurs at exposed areas, whereby the exposed portions of the layer either become insoluble or soluble in a solvent, and (2), directly on said layer (1), a layer of photosensitive silver halide which is developable using an aqueous developer solution for the silver halide and comprising a dispersion of particles of photosensitive silver halide grains coated with a water soluble polymer in an oleophilic binder resin capable of being dissolved in a developer for said photosensitive resin composition, wherein the ratio of the silver halide to the water-soluble polymer, by weight, is 8:1 to 1:6 and the oleophilic binder is used in an amount of from 0.001 to 0.5 parts by weight per part by weight of the silver halide grains, to light to which only said silver halide containing layer is sensitive, developing the silver halide emulsion layer using an aqueous developer solution for the silver halide to form a silver image, then subjecting the photosensitive printing plate to an overall exposure to light to which said photosensitive resin composition layer is sensitive, and then developing the photosensitive resin composition layer with a developer which dissolves the oleophilic binder resin in said silver halide containing layer and only one of either the exposed portions or the unexposed portions of said photosensitive resin composition layer.

* * * * *